United States Patent
Ganti et al.

(10) Patent No.: US 7,145,936 B2
(45) Date of Patent: Dec. 5, 2006

(54) BANDPASS DELTA SIGMA TRUNCATOR AND METHOD OF TRUNCATING A MULTI-BIT DIGITAL SIGNAL

(75) Inventors: Ramkishore Ganti, Dripping Springs, TX (US); Aria Eshraghi, Boston, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/536,946

(22) PCT Filed: Dec. 23, 2002

(86) PCT No.: PCT/US02/41396

§ 371 (c)(1),
(2), (4) Date: May 31, 2005

(87) PCT Pub. No.: WO2004/059855

PCT Pub. Date: Jul. 15, 2004

(65) Prior Publication Data

US 2006/0120465 A1    Jun. 8, 2006

(51) Int. Cl.
- H04B 1/707 (2006.01)
- H04B 14/06 (2006.01)
- H03M 3/00 (2006.01)

(52) U.S. Cl. .................. 375/146; 375/250; 341/143
(58) Field of Classification Search ................ 375/146, 375/252, 350; 341/143–144
See application file for complete search history.

(56) References Cited

U.S. PATENT DOCUMENTS

| | | | |
|---|---|---|---|
| 5,181,032 A * | 1/1993 | Ribner | 341/143 |
| 5,424,739 A | 6/1995 | Norsworthy et al. | |
| 5,559,905 A * | 9/1996 | Greggain et al. | 382/298 |
| 5,581,253 A | 12/1996 | Brown | |
| 5,644,308 A * | 7/1997 | Kerth et al. | 341/120 |
| 5,682,161 A | 10/1997 | Ribner et al. | |
| 5,910,960 A | 6/1999 | Claydon et al. | |
| 6,075,474 A * | 6/2000 | Gabet et al. | 341/143 |
| 6,249,238 B1 | 6/2001 | Steinlechner | |
| 6,304,608 B1 * | 10/2001 | Chen et al. | 375/252 |
| 6,373,418 B1 | 4/2002 | Abbey | |
| 6,389,069 B1 | 5/2002 | Mathe | |
| 6,513,055 B1 | 1/2003 | Boran | |
| 6,970,511 B1 * | 11/2005 | Barnette | 375/240.21 |
| 2002/0008588 A1 | 1/2002 | Kahan | |
| 2002/0012411 A1 | 1/2002 | Heinzl et al. | |

* cited by examiner

*Primary Examiner*—Emmanuel Bayard
*Assistant Examiner*—Lawrence B. Williams
(74) *Attorney, Agent, or Firm*—RatnerPrestia

(57) ABSTRACT

A bandpass delta sigma truncator receives a series of first multi-bit digital signals each having a number of data bits, a first number of sign bits and sign extending means for sign extending each of the first multi-bit digital signals to a second multi-bit digital signal having the same number of data bits as the number of data bits in the first multi-bit digital signals, and a second number of sign bits. The truncator outputs from a series of third multi-bit digital signals a series of fourth multi-bit digital signals each having a selected number of the most significant data bits of the third multi-bit digital signals, and a series of fifth multi-bit digital signals each having the remaining number of the least significant data bits of the third multi-bit digital signals.

10 Claims, 2 Drawing Sheets

BANDPASS DELTA SIGMA TRUNCATOR AND METHOD OF TRUNCATING A MULTI-BIT DIGITAL SIGNAL

This application is a U.S. National Phase Application of PCT International Application No. PCT/US02/41396, filed Dec. 23, 2002.

TECHNICAL FIELD

The present invention relates, in general, to radio frequency transmission and, in particular, to a sigma delta truncator that reduces noise in radio frequency transmissions by bit reduction of multi-bit digital signals and to a method of truncating multi-bit digital signals to reduce noise.

BACKGROUND OF THE INVENTION

In a typical wireless system such as WCDMA, the baseband signal processing must meet two main specifications: (1) the in-band Error Vector Magnitude (EVM), and (2) the out-of-band Adjacent Channel Leakage Ratio (ACLR) as well as other speicifcations. The limits imposed on both EVM and ACLR are stringent.

For WCDMA applications, there is an in-band EVM specification for the transmitter and an out-of-band ACLR specification at 5 MHZ and 10 MHZ. Usually, there is strong filtering at 10 MHZ which helps in reducing the 10 MHZ ACLR specification, but 5 MHZ is so close to the signal band that the 5 MHZ ACLR specification is somewhat more difficult to meet. Because all of the blocks in the transmit chain have an effect on meeting the ACLR specification, the effect of each should be well below the specification for the overall specification of the system to be met.

The ACLR specification at 5 MHZ determines the number of bits required in the digital-to-analog converter. For WCDMA applications, this number is usually nine or ten bits. The other specifications, namely EVR and the 10 MHZ ACLR) usually can be satisfied with six bits.

SUMMARY OF THE INVENTION

The present invention is a bandpass delta sigma truncator that effectively truncates the signals so that six bit digital-to-analog converters can be used in the signal processing circuitry and the EVM and 5 MHZ and 10 MHZ ACLR specifications are satisfied. This bandpass delta sigma truncator includes input means for receiving a series of first multi-bit digital signals each having a number of data bits and a first number of sign bits. Also included in this bandpass delta sigma truncator are sign extending means for sign extending each of the first multi-bit digital signals to a second multi-bit digital signal having the same number of data bits as the number of data bits in the first multi-bit digital signals and a second number of sign bits. A bandpass delta sigma truncator, constructed in accordance with the present invention, further includes output means for supplying from a series of third multi-bit digital signals each individually associated with one of the second multi-bit digital signals and each having the same number of data bits as in an associated second multi-bit digital signal a series of fourth multi-bit digital signals each having a selected number of the most significant data bits of the third multi-bit digital signals and a series of fifth multi-bit digital signals each having the remaining number of the least significant data bits of the third multi-bit digital signals. Also included in this bandpass delta sigma truncator are means for delaying by a period of time equal to the time between successive first multi-bit digital signals each of the fifth multi-bit digital signals and delaying by a period of time equal to twice the time between successive first multi-bit digital signals each of the fifth multi-bit digital signals and inverting the fifth multi-bit digital signals that have been delayed by a period of time equal to twice the time between successive first multi-bit digital signals. Each of the fifth multi-bit digital signals delayed by a period of time equal to the time between successive first multi-bit digital signals is multiplied by a multiplier number related to the ratio of a selected frequency to the frequency of the first multi-bit digital signals to develop a series of sixth multi-bit digital signals having a number of data bits that is the product of the multiplier number and the number of data bits in the fifth multi-bit digital signals. A bandpass delta sigma truncator, constructed in accordance with the present invention, further includes summing means for adding to each second multi-bit digital signal a fifth multi-bit digital signal that has been delayed by a period of time equal to twice the time between successive first multi-bit digital signals and inverted and a sixth multi-bit digital signal to develop the series of third multi-bit digital signals.

A method for truncating a multi-bit digital signal in accordance with the present invention includes the steps of providing a series of first multi-bit digital signals each having a number of data bits and a first number of sign bits and sign extending each of the first multi-bit digital signals to a second multi-bit digital signal having the same number of data bits as the number of data bits in the first multi-bit digital signals and a second number of sign bits. This method also includes the step of adding to each second multi-bit digital signal to develop a series of third multi-bit digital signals each individually associated with one of the second multi-bit digital signals and each having the same number of data bits as in an associated second multi-bit digital signal a multi-bit digital signal that has been developed from a selected number of the least significant bits of the third multi-bit digital signals and delayed by a period of time equal to twice the time between successive first multi-bit digital signals and inverted and a multi-bit digital signal that has been developed from the selected number of the least significant bits of the third multi-bit digital signals and delayed by a period of time equal to the time between successive first multi-bit digital signals and multiplied by a multiplier number related to the ratio of a selected frequency to the frequency of the first multi-bit digital signals. A series of fourth digital signals each having a selected number of the most significant data bits of the third multi-bit digital signals is developed from the third multi-bit digital signals.

DETAILED DESCRIPTION OF THE INVENTION

Figure 1:
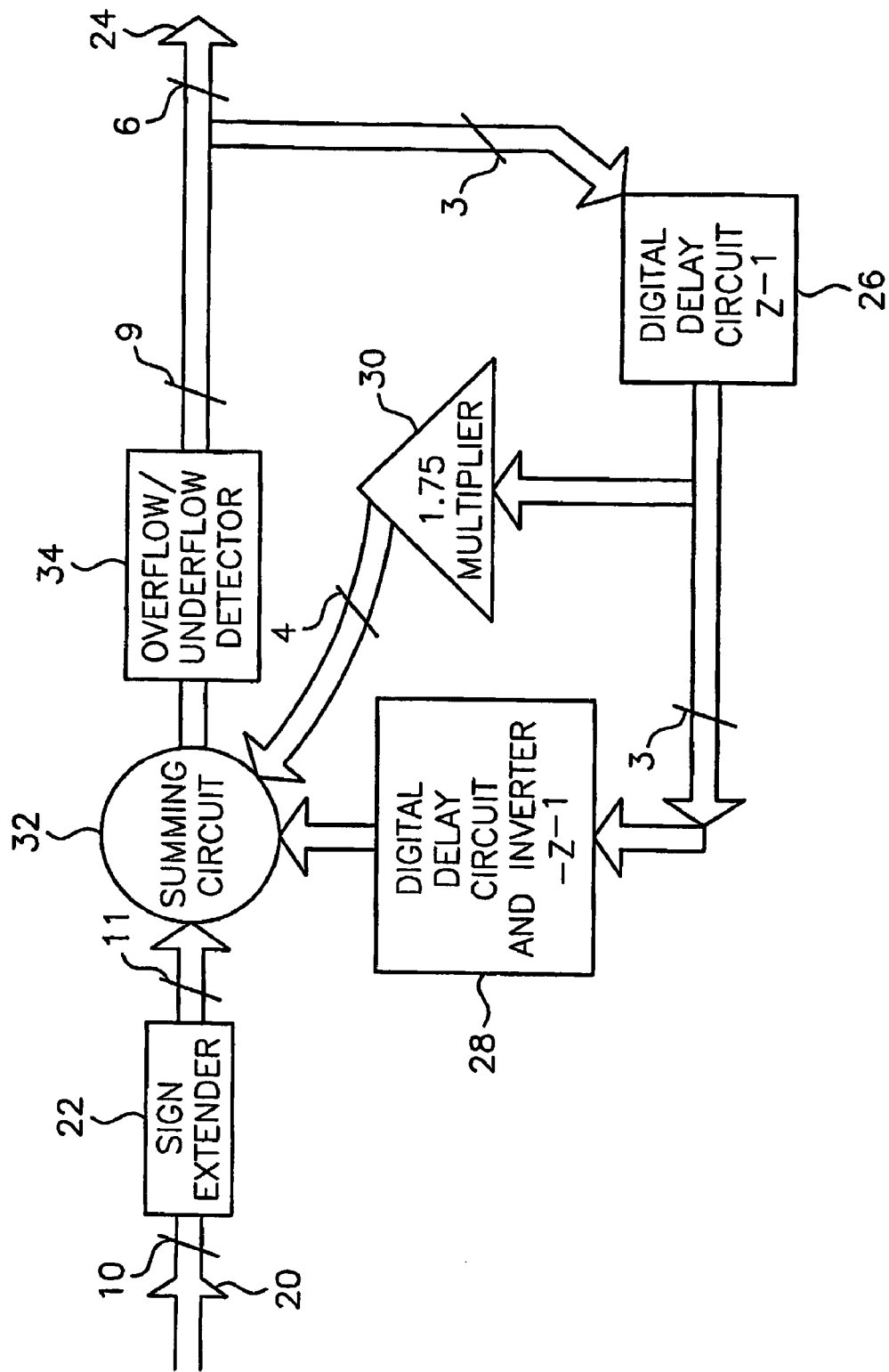
FIG. 1 is a block diagram of a bandpass delta sigma truncator constructed in accordance with the present invention.

Referring to FIG. 1, a bandpass delta sigma truncator, constructed in accordance with the present invention, includes input means for receiving a series of first multi-bit digital signals each having a number of data bits and a first number of sign bits. Such means are represented by an input terminal 20 connected, for example, to a baseband processor (not shown) from which the series of first multi-bit digital signals are supplied.

The bandpass delta sigma truncator of the present invention also includes sign extending means for sign extending each of the first multi-bit digital signals to a second multi-bit digital signal having the same number of data bits as the number of data bits in the first multi-bit digital signals and a second number of sign bits. Such means can be a sign extender 22 of conventional construction and operation. As will become clear below, the sign extension function serves to detect overflow or underflow as the first multi-bit digital signals are modified in accordance with the present invention.

The FIG. 1 bandpass delta sigma truncator further includes output means for supplying from a series of third multi-bit digital signals each individually associated with one of the second multi-bit digital signals and each having the same number of data bits as in an associated second multi-bit digital signal a series of fourth multi-bit digital signals each having a selected number of the most significant data bits of the third multi-bit digital signals and a series of fifth multi-bit digital signals each having the remaining number of the least significant data bits of the third multi-bit digital signals. Such output means are represented by an output terminal 24 connected, for example, to a digital-to-analog converter (not shown) to which the fourth multi-bit digital signals are supplied. The manner in which the series of third multi-bit digital signals is developed is explained below.

Also included in the FIG. 1 bandpass delta sigma truncator are means for delaying by a period of time equal to the time between successive first multi-bit digital signals each of the fifth multi-bit digital signals and delaying by a period of time equal to twice the time between successive first multi-bit digital signals each of the fifth multi-bit digital signals and inverting the fifth multi-bit digital signals that have been delayed by a period of time equal to twice the time between successive first multi-bit digital signals. For the embodiment of the invention being described, such means include a digital delay circuit 26 for delaying by a period of time equal to the time between successive first multi-bit digital signals each of the fifth multi-bit digital signals and a digital delay and inverter circuit 28 for additionally delaying by a period of time equal to the time between successive first multi-bit digital signals each of the fifth multi-bit digital signals delayed by digital delay circuit 26 and inverting the additionally delayed fifth multi-bit digital signals. Digital delay circuit 26 and digital delay and inverter circuit 28 can be of conventional construction and operation.

The FIG. 1 bandpass delta sigma truncator further includes means for multiplying by a multiplier number related to the ratio of a selected frequency to the frequency of the first multi-bit digital signals each of the fifth multi-bit digital signals delayed by a period of time equal to the time between successive first multi-bit digital signals and developing a series of sixth multi-bit digital signals having a number of data bits that is the product of the multiplier number and the number of data bits in the fifth multi-bit digital signals. Specifically, each fifth multi-bit digital signal delayed by delay circuit 26 is multiplied by a multiplier 30 of conventional construction and operation.

A bandpass delta sigma truncator, constructed in accordance with the present invention, further includes summing means for adding to each second multi-bit digital signal delivered by sign extender 22 a fifth multi-bit digital signal that has been delayed by a period of time equal to twice the time between successive first multi-bit digital signals and inverted and a sixth multi-bit digital signal to develop the series of third multi-bit digital signals. Such summing means can be a summing circuit 32 of conventional construction and operation.

A bandpass delta sigma truncator, constructed in accordance with the present invention, preferably includes means between summing circuit 32 and output terminal 24 for determining whether the value of the output of the summing circuit, namely the third multi-bit digital signal, is either greater than a first value or less than a second value. Such means can be an overflow/underflow detector 32 of conventional construction and operation. Overflow/underflow detector 34 serves to prevent the delta sigma truncator from becoming unstable.

As indicated above, for:

(a) the 5 MHZ ACLR specification, a ten bit digital-to-analog converter is required in the signal processing circuitry;

(b) the 10 MHZ ACLR specification, a six bit digital-to-analog converter can be used in the signal processing because the signals can be truncated at a lowpass filter located downstream from the delta sigma truncator; and (c) the EVM specification, a six bit digital-to-analog converter can be used in the signal processing.

In the preferred signal processing circuitry, the digital-to-analog converter is a six bit unit. Simply dropping the four least significant bits of each input ten bit digital signal results in six bit resolution which is inadequate for the 5 MHZ ACLR specification that requires ten bit resolution.

For a selected WCDMA application of a bandpass delta sigma truncator, constructed in accordance with the present invention:

(a) each first multi-bit digital signal supplied to input terminal 20 is a ten bit digital signal having nine data bits and one sign bit, (b) each second multi-bit digital signal developed by sign extender 22 is an eleven bit digital signal having nine data bits and two sign bits, (c) each third multi-bit digital signal developed by summing circuit 32 is a nine bit digital signal having nine data bits, (d) each fourth multi-bit digital signal that is outputted from the bandpass delta sigma truncator is a six bit digital signal having six data bits, (e) each fifth multi-bit digital signal delivered to digital delay circuit 26 is a three bit digital signal having three data bits, (f) each sixth multi-bit digital signal developed by multiplier 30 is a four bit digital signal having four data bits, (g) the multiplier number of multiplier 30 is 1.75, (h) the selected frequency is 5 MHZ, and (i) the frequency of the first multi-bit digital signals is 30 MHZ.

The multiplier number of 1.75 is derived as follows. For zero noise shaping at 5 MHZ and a sampling frequency of 60 MHZ $$\frac{5 \text{ MHZ}}{60 \text{ MHZ}} = \frac{\cos 30°}{\cos 360°}$$

$$2 \cos 30° = sqrt\ 3 = 1.73$$

1.73 is approximately 1.75.

The 1.75 multiplication by multiplier 30 of the three bit digital signal delivered to the multiplier is accomplished by multiplying the three bit digital signal, subtracting the three bit digital signal, and dividing the result by four (bit shifting operation in digital operation):

$$\frac{8(\text{three bit digital signal}) - (\text{three bit digital signal})}{4} = \frac{7}{4} = 1.75$$

Overflow/underflow detector 34 detects an overflow when the tenth bit of the output from summing circuit 32 becomes a "1" and overflow/underflow detector 34 detects an underflow when the eleventh bit of the output from summing circuit 32 becomes a "1". When an overflow condition is detected, the nine data bits of the output from summing circuit 32 become "1"s and when an underflow condition is detected (i.e., a negative value), the nine data bits of the output from summing circuit 32 become "0"s. Although the data in the signals is destroyed when an overflow condition or an underflow condition is detected, because this occurs so infrequently, there is no meaningful adverse effect on the overall transmission of data.

Figure 2:
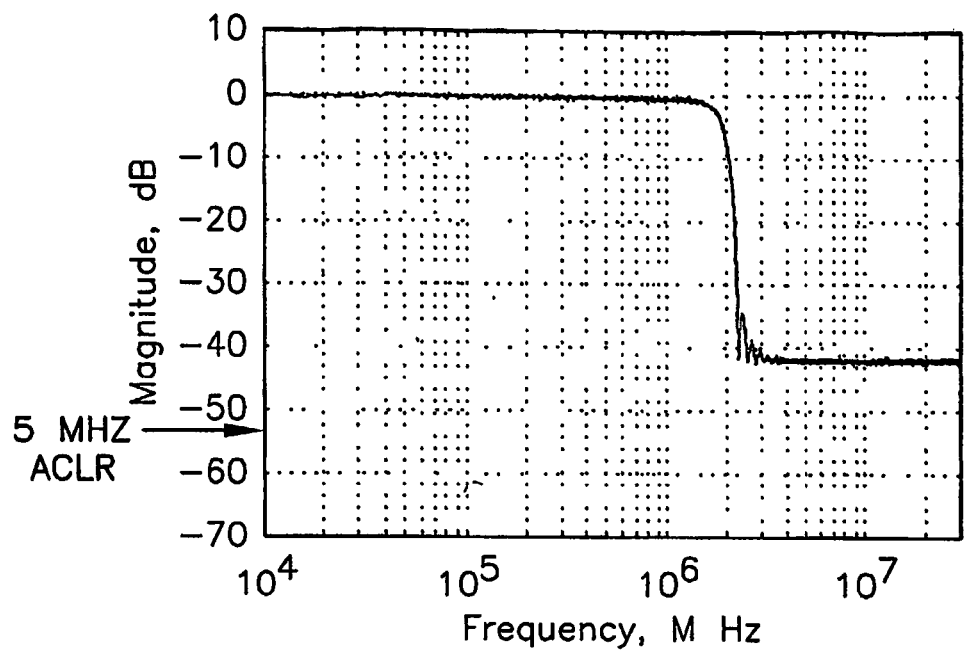
FIG. 2 shows the noise level of data of signals directly truncated to six bits.

FIG. 2 shows the noise level data directly truncated to six bits. The noise level at 5 MHZ is much higher than the 5 MHZ ACLR specification.

Figure 3:
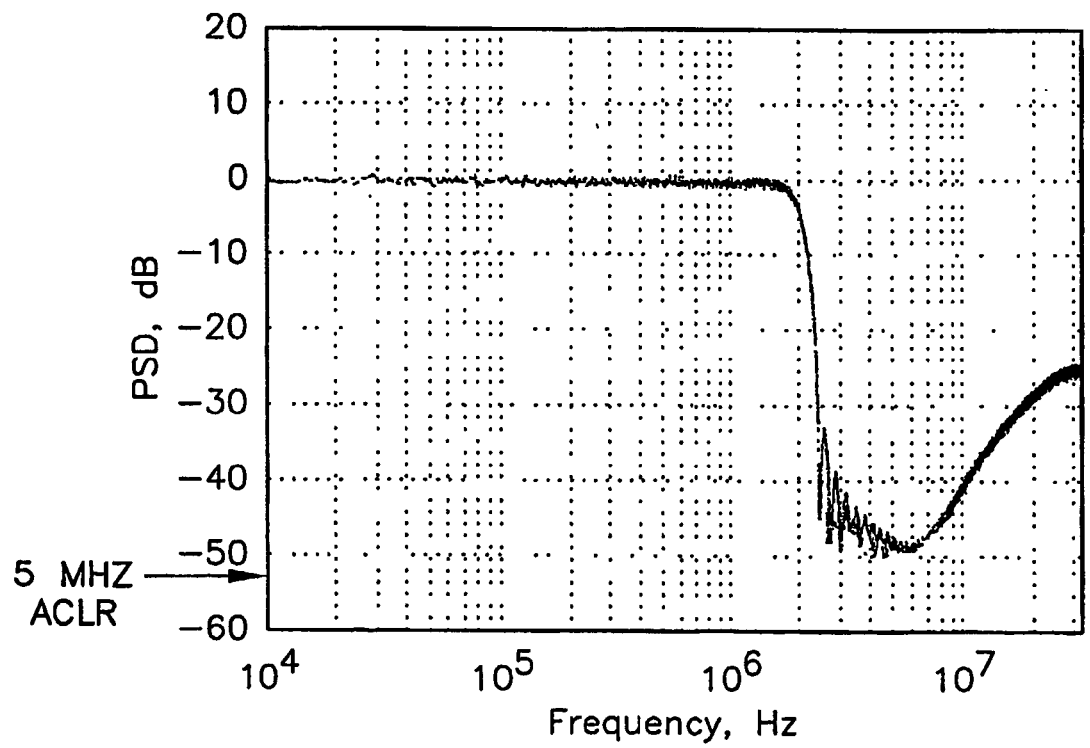
FIG. 3 shows the noise level of data truncated to six bits by a bandpass delta sigma truncator constructed in accordance with the present invention.

FIG. 3 shows the noise level of data truncated to six bits by a bandpass delta sigma truncator constructed in accordance with the present invention. The noise level at 5 MHZ is bottoms at approximately the 5 MHZ ACLR specification with a shift in the noise level to higher frequencies at which the noise can be removed by filters.

Although illustrated and described herein with reference to an exemplary embodiment, the present invention, nevertheless, is not intended to be limited to the details shown and described. Rather, various modifications may be made to the exemplary embodiment within the scope and range of equivalents of the claims without departing from the invention.

What is claimed is:

1. A bandpass delta sigma truncator comprising:
   input means for receiving a series of first multi-bit digital signals each having:
      (a) a number of data bits, and
      (b) a first number of sign bits;
   sign extending means for sign extending each of the first multi-bit digital signals to a second multi-bit digital signal having:
      (a) the same number of data bits as the number of data bits in the first multi-bit digital signals, and
      (b) a second number of sign bits;
   output means for supplying from a series of third multi-bit digital signals each individually associated with one of the second multi-bit digital signals and each having the same number of data bits as in an associated second multi-bit digital signal:
      (a) a series of fourth multi-bit digital signals each having a selected number of the most significant data bits of the third multi-bit digital signals, and
      (b) a series of fifth multi-bit digital signals each having the remaining number of the least significant data bits of the third multi-bit digital signals;
   means for:
      (a) delaying by a period of time equal to the time between successive first multi-bit digital signals each of the fifth multi-bit digital signals, and
      (b) delaying by a period of time equal to twice the time between successive first multi-bit digital signals each of the fifth multi-bit digital signals and inverting the fifth multi-bit digital signals that have been delayed by a period of time equal to twice the time between successive first multi-bit digital signals;
   means for multiplying by a multiplier number related to a ratio of a selected frequency to the frequency of the first multi-bit digital signals each of the fifth multi-bit digital signals delayed by a period of time equal to the time between successive first multi-bit digital signals and developing a series of sixth multi-bit digital signals having a number of data bits that is a product of the multiplier number and the number of data bits in the fifth multi-bit digital signals; and
   summing means for adding to each second multi-bit digital signal:
      (a) a fifth multi-bit digital signal that has been delayed by a period of time equal to twice the time between successive first multi-bit digital signals and inverted, and
      (b) a sixth multi-bit digital signal to develop the series of third multi-bit digital signals.

2. A bandpass delta sigma truncator according to claim 1 wherein:
   (a) each first multi-bit digital signal is a ten bit digital signal having nine data bits and one sign bit,
   (b) each second multi-bit digital signal is an eleven bit digital signal having nine data bits and two sign bits,
   (c) each third multi-bit digital signal is a nine bit digital signal having nine data bits,
   (d) each fourth multi-bit digital signal is a six bit digital signal having six data bits,
   (e) each fifth multi-bit digital signal is a three bit digital signal having three data bits,
   (f) each sixth multi-bit digital signal is a four bit digital signal having four data bits,
   (g) the multiplier number is 1.75,
   (h) the selected frequency is 5 MHZ, and
   (i) the frequency of the first multi-bit digital signals is 30 MHZ.

3. A bandpass delta sigma truncator according to claim 1 further including means between said summing means and said output means for determining whether the value of any third multi-bit digital signal is one of:
   (a) greater than a first value, and
   (b) less than a second value.

4. A bandpass delta sigma truncator according to claim 2 further including means between said summing means and said output means for determining whether the value of any third multi-bit digital signal is one of:
   (a) greater than a first value, and
   (b) less than a second value.

5. A bandpass delta sigma truncator according to claim 2 wherein said means for delaying and inverting the fifth multi-bit digital signals include:
   (a) a digital delay circuit for delaying by a period of time equal to the time between successive first multi-bit digital signals each of the fifth multi-bit digital signals, and
   (b) a digital delay and inverter circuit for:
      (1) additionally delaying by a period of time equal to the time between successive first multi-bit digital signals each of the fifth multi-bit digital signals delayed by said digital delay circuit, and
      (2) inverting the additionally delayed fifth multi-bit digital signals.

6. A bandpass delta sigma truncator according to claim 4 wherein said means for delaying and inverting the fifth multi-bit digital signals include:

(a) a digital delay circuit for delaying by a period of time equal to the time between successive first multi-bit digital signals each of the fifth multi-bit digital signals, and
(b) a digital delay and inverter circuit for:
  (1) additionally delaying by a period of time equal to the time between successive first multi-bit digital signals each of the fifth multi-bit digital signals delayed by said digital delay circuit, and
  (2) inverting the additionally delayed fifth multi-bit digital signals.

7. A method for truncating a multi-bit digital signal comprising the steps of:
  providing a series of first multi-bit digital signals each having:
    (a) a number of data bits, and
    (b) a first number of sign bits;
  sign extending each of the first multi-bit digital signals to a second multi-bit digital signal having:
    (a) the same number of data bits as the number of data bits in the first multi-bit digital signals, and
    (b) a second number of sign bits;
  adding to each second multi-bit digital signal to develop a series of third multi-bit digital signals each individually associated with one of the second multi-bit digital signals and each having the same number of data bits as in an associated second multi-bit digital signal:
    (a) a multi-bit digital signal that has been:
      (1) developed from a selected number of the least significant bits of the third multi-bit digital signals, and
      (2) delayed by a period of time equal to twice the time between successive first multi-bit digital signals and inverted, and
    (b) a multi-bit digital signal that has been:
      (1) developed from the selected number of the least significant bits of the third multi-bit digital signals, and
      (2) delayed by a period of time equal to the time between successive first multi-bit digital signals and multiplied by a multiplier number related to a ratio of a selected frequency to the frequency of the first multi-bit digital signals; and
  developing from the third multi-bit digital signals a series of fourth digital signals each having a selected number of the most significant data bits of the third multi-bit digital signals.

8. A method for truncating a multi-bit digital signal according to claim 7 wherein:
  (a) each first multi-bit digital signal is a ten bit digital signal having nine data bits and one sign bit,
  (b) each second multi-bit digital signal is an eleven bit digital signal having nine data bits and two sign bits,
  (c) each third multi-bit digital signal is a nine bit digital signal having nine data bits,
  (d) each fourth multi-bit digital signal is a six bit digital signal having six data bits,
  (e) each multi-bit digital signal that has been delayed by a period of time equal to twice the time between successive first multi-bit digital signals and inverted is a three bit digital signal having three data bits,
  (f) each multi-bit digital signal delayed by a period of time equal to the time between successive first multi-bit digital signals and multiplied by a multiplier number related to the ratio of a selected frequency to the frequency of the first multi-bit digital signals is a four bit digital signal having four data bits,
  (g) the multiplier number is 1.75,
  (h) the selected frequency is 5 MHZ, and
    (1) the frequency of the first multi-bit digital signals is 30 MHZ.

9. A method for truncating a multi-bit digital signal according to claim 7 further including the step of determining whether the value of any third multi-bit digital signal is one of:
  (a) greater than a first value, and
  (b) less than a second value.

10. A method for truncating a multi-bit digital signal according to claim 8 further including the step of determining whether the value of any third multi-bit digital signal is one of:
  (a) greater than a first value, and
  (b) less than a second value.

* * * * *